(12) United States Patent
Omi et al.

(10) Patent No.: US 6,713,820 B2
(45) Date of Patent: Mar. 30, 2004

(54) SEMICONDUCTOR DEVICE

(75) Inventors: Toshihiko Omi, Chiba (JP); Kazutoshi Ishii, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/119,420

(22) Filed: Apr. 8, 2002

(65) Prior Publication Data
US 2002/0153576 A1 Oct. 24, 2002

(30) Foreign Application Priority Data

Apr. 19, 2001 (JP) ......................................... 2001-110386
Apr. 19, 2001 (JP) ......................................... 2001-121335
Mar. 28, 2002 (JP) ......................................... 2002-092275

(51) Int. Cl.[7] ............................................... H01L 29/76
(52) U.S. Cl. ..................... 257/382; 257/328; 257/355; 257/341; 257/343; 257/394; 257/902
(58) Field of Search ................................. 257/382, 355, 257/356, 328, 341, 343, 346, 394, 362, 401, 902

(56) References Cited

U.S. PATENT DOCUMENTS

| 5,610,427 | A | * | 3/1997 | Shida | 257/362 |
| 5,844,281 | A | * | 12/1998 | Narita | 257/356 |
| 6,064,089 | A | * | 5/2000 | Jinbo | 257/346 |
| 6,121,657 | A | * | 9/2000 | Yama | 257/341 |
| 6,204,542 | B1 | * | 3/2001 | Kinoshita et al. | 257/401 |
| 6,281,553 | B1 | * | 8/2001 | Sasaki | 257/356 |

* cited by examiner

Primary Examiner—David Nelms
Assistant Examiner—Andy Huynh
(74) Attorney, Agent, or Firm—Adams & Wilks

(57) ABSTRACT

A semiconductor device is provided in which each of contacts between a source and a drain of a MOS transistor and a metallic wiring is either a contact having an arbitrary one side longer than the other side, or source contacts and well contacts are made batting contacts each having an arbitrary one side of a diffusion region having the same polarity as that of a well shorter than the other side. Thus, the contact shape is longitudinal in a transistor width direction, which makes it possible that a large current is caused to flow with a small interval of gates thereof.

15 Claims, 6 Drawing Sheets

SEMICONDUCTOR DEVICE

BACKGROUND OF THE INVENTION

1. Field of the Invention

A semiconductor device constituted by MOS transistors is applied in diverse fields such as home electric appliances, AV equipment, information equipment, communication equipment and automobile electric equipment. In recent years, the need for power management ICs having the function of being able to supply a stable power source such as a voltage regulator, a switching regulator or a charge pump regulator, a voltage monitoring function such as a voltage detector or battery protection, or an over-current monitoring function has increased along with the portability of electrical machinery and devices. The present invention relates to a semiconductor device which has the power source supplying function and the power source monitoring function as described above.

2. Description of the Related Art

In MOS transistors for use in semiconductor devices, normally, there are used contacts each having a contact size of a minimum value of the process limit of normal contacts, or a minimum value of the process rule for manufacture of the MOS transistors. The maximum amount of current allowed to flow by one contact normally depends on the contact size. Therefore, with respect to the size of a contact of a MOS transistor connected between terminals of a semiconductor device for the purpose of protecting a MOS transistor used in an output stage requiring a large current or an internal circuit of a semiconductor device from the electrostatic breakdown, although a contact having a size larger than that of a minimum value of the process limit of contacts or a minimum value of the contact rule for manufacture of the MOS transistors may be employed in some cases, normally a contact is employed the sides of which have the same length.

FIG. 6 shows a MOS transistor connected between the terminals of the semiconductor device for the purpose of protecting a MOS transistor used in an output stage requiring a large current or an internal circuit of the semiconductor device from the electrostatic breakdown, and contacts of a source and contacts of a well are arranged close to each other in order to prevent the parasitic bipolar operation and the latch-up. Furthermore, in the case where it is strongly required to prevent the parasitic bipolar operation and the latch-up, contacts of a source and contacts of a well are made batting contacts in many cases.

In the case where contacts of a source and contacts of a well are made batting contacts, conventionally, the batting contacts are formed as shown in the arrangement of FIG. 6.

Numeral 1 is a PMOS region, 2 is an N-type diffusion region, 3 is an N-type well, 4 is a gate, 5 is a drain, 6 is a source, 7 is a gate wiring, 8 is a drain wiring, 9 is a source or well wiring, 11 is a gate contact, 12 is a drain contact, 13 is a source contact, and 14 is a well contact.

However, some MOS transistors which are each connected between terminals of a semiconductor device for the purpose of protecting a MOS transistor used in an output stage requiring a large current or an internal circuit of a semiconductor device from the electrostatic breakdown, have a transistor width ranging from several hundreds of $\mu$m to several tens of mm, which is large in size. Each of these MOS transistors used generally has a shape in which a plurality of gates are arranged in parallel with one another. For this reason, in MOS transistors each having a large transistor width, the interval of the adjacent gates influences greatly on the transistor size.

While the interval of the adjacent gates in a drain is determined by a distance between a gate and a contact, and a contact size, the interval of the adjacent gates in a source is determined by a distance between a gate and a contact, a contact size and a width of a diffusion region, having the same polarity as that of a well, for obtaining the well contact.

In the above-mentioned power management IC, for the purpose of preventing a MOS transistor used in a output stage, or an internal circuit of a semiconductor device from the electrostatic breakdown, the rate of occupation of the MOS transistor connected between the terminals of the semiconductor device in a chip is large. Therefore, a MOS transistor is desired which has a contact shape of a drain, a source or a well allowing a larger current to flow with a smaller gate interval, and a batting contact shape allowing a smaller gate interval.

SUMMARY OF THE INVENTION

In the light of the foregoing, the present invention solves the above-mentioned problems by employing a contact between each portion of a MOS transistor and metallic wiring, the contact having one arbitrary side that is longer than the other side in a semiconductor device constituted by MOS transistors.

That is, with respect to a shape of the contact, an arbitrary one side of the contact is made longer than the other side, and the longer side of the contact is formed in parallel with a transistor width (or channel width) direction of the MOS transistor, whereby it is possible to lengthen a side not contributing to the interval of the adjacent gates while maintaining a side contributing to the interval of the adjacent gates short. As a result, it is possible to increase the area of the contact to increase further a current caused to flow through the contact.

At this time, the length of the shorter side of the contact is made a minimum value of a contact rule for manufacture of the MOS transistor, whereby it is possible to minimize the interval of the adjacent gates.

In addition, in a MOS transistor in which contacts of a source and contacts of a well of the above-mentioned MOS transistor are made batting contacts, an arbitrary one side of a diffusion region having the same polarity as that of a well of a well contact portion of the batting contact is shorter than the other side, the one side shorter than the other side of the diffusion region having the same polarity as that of the well is formed in a transistor width direction, and the length of the batting contact in a gate length direction is made shorter than the length of the diffusion region having the same polarity as that of the well in a gate length direction. Thus, the present invention intends to solve the above-mentioned problems associated with the prior art.

An amount of overlapping between the batting contact and the diffusion region having the same polarity as that of the well in the gate length direction may be made a minimum value having the margin estimated from the process accuracy of the batting contact, and the alignment accuracy between the batting contacts and the diffusion region.

At this time, with respect to the shape of the batting contact, an arbitrary one side of the contact is longer than the other side, and the one side longer than the other side of the contact is formed in a transistor width direction, whereby it is possible to further shorten the interval of the adjacent gates. In addition, the length of the shorter side of the contact is made a minimum value of the process limit of contacts, or a minimum value of a contact rule for manufacture of the above-mentioned MOS transistor, whereby it is possible to minimize the interval of the adjacent gates.

The contact or the batting contact having the shape as described above may be applied to only a contact requiring a large current, and may be applied to a contact with a drain, a source or a substrate of a MOS transistor connected between the terminals of the semiconductor device for the purpose of protecting a MOS transistor used in an output stage or an internal circuit of the semiconductor device from the electrostatic breakdown. Also, a contact of a MOS transistor used in an internal circuit may be a square contact one side of which is made a minimum value of the process limit of contacts, or a minimum value of the process rule for manufacture of the MOS transistor. At this time, the length of the shorter side of the contact having the above-mentioned shape, if there is no problem for the process of the contacts, maybe shorter than a side of a contact of a MOS transistor used in an internal circuit.

In addition, the contacts each having the above-mentioned shape or the batting contacts may be arranged at contact intervals of a minimum value of the process limit of contacts or a minimum value of the process rule for manufacture of the MOS transistor within a transistor width of the MOS transistor connected between the terminals of the semiconductor device for the purpose of protecting a MOS transistor used in an output stage or an internal circuit of the semiconductor device from the electrostatic breakdown, as much as possible.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE PREFERRED EMBODIMENTS

Figure 1:
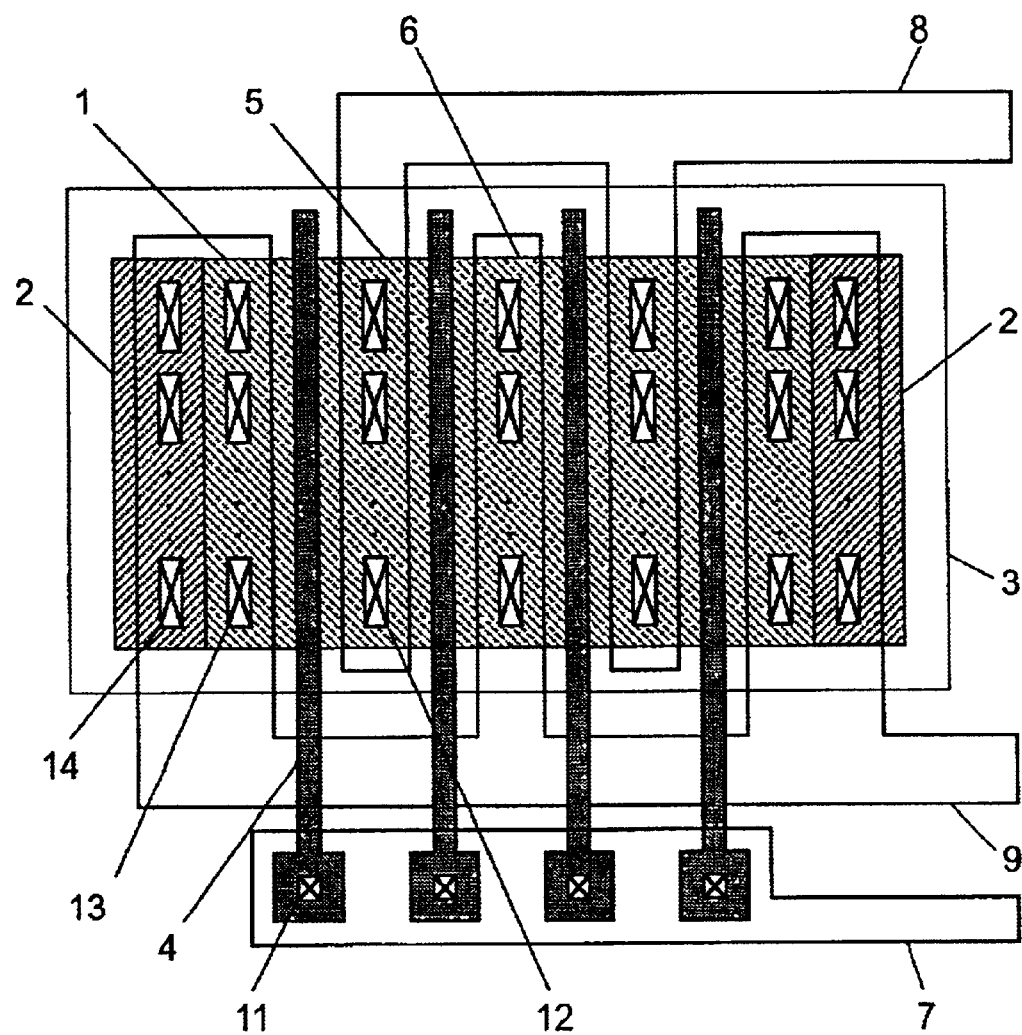
FIG. 1 is a plan view showing a structure according to a first embodiment of the present invention.

Preferred embodiments of the present invention will hereinafter be described in detail with reference to the accompanying drawings. In the drawings, numeral 1 is a PMOS region, 2 is an N-type diffusion region, 3 is an N-type well, 4 is a gate, 5 is a drain, 6 is a source, 7 is a gate wiring, 8 is a drain wiring, 9 is a source or well wiring, 11 is a gate contact, 12 is a drain contact, 13 is a source contact, 14 is a well contact, and 15 is a batting contact.

FIG. 1 is a plan view showing a NOS transistor according to the present invention. A description will now be given with respect to an example of a PMOS transistor in an output stage of a semiconductor device. The MOS transistor includes four gates 4. Since each gate width is 100 $\mu$m, the transistor width is 400 $\mu$m in total. Also, a gate length is 1.0 $\mu$m. The transistor is formed in an N type well 3 into which phosphorus was diffused. The transistor includes a PMOS active region 1 into which boron was diffused, and a drain region 5 and a source region 6 are both formed in the PMOS active region 1. An N type diffusion region 2 for electric potential contact with the N type well is formed adjacent to the PHOS region 1. by diffusing arsenic. The gates 4 each made of polycrystalline silicon having phosphorus diffused thereinto are formed on the P type region 1. With respect to contacts of a gate, a drain, a source and a well of the MOS transistor, a contact 11 with 1.0 $\mu$m×1.0 $\mu$m is formed as the contact of the gate, contacts 12 each with 1.0 $\mu$m×3.0 $\mu$m are formed as the contacts of the drain at intervals of 1.0 $\mu$m, contacts 13 each with 1.0 $\mu$m×3.0 $\mu$m are formed as the contacts of the source at intervals of 1.0 $\mu$m, and contacts 14 each with 1.0 $\mu$m×3.0 $\mu$m are formed as the contacts of the well at intervals of 1.0 $\mu$m. By employing an aluminum wiring mixed with a very small quantity of silicon and copper, the gate contact 11 is connected to a gate wiring 7, the drain contacts 12 are connected to a drain wiring 8, and the source contacts 13 and the well contacts 14 are respectively connected to a wiring 9. The distance between the drain contacts 12 and the gate is 1.0 $\mu$m, and the distance between the source contacts 13 and the gate is 0.8 $\mu$m. In addition, the distance between the drain contacts 12 and the P type region 1 is 1.0 $\mu$m, and the distance between the source contacts 13 and the P type region 1 is 0.8 $\mu$m.

In this MOS transistor, an interval of the adjacent gates is 3.0 $\mu$m for the drain, and is 2.6 $\mu$m for the source. The allowable current of this MOS transistor was the same as that in the case where each of the sizes of the drain contacts and the source contacts is 3.0 $\mu$m×3.0 $\mu$m. In the case of the MOS transistor in which each of the sizes of the drain contacts and the source contacts is 3.0 $\mu$m×3.0 $\mu$m, the interval of the adjacent gates is 5.0 $\mu$m for the drain and is 4.6 $\mu$m for the source. Now, in the MOS transistor of the present invention, the size of the P type active region is 17.8 $\mu$m×100 $\mu$m, whereas in the case where each of the sizes of the drain contacts and the source contacts is 3.0 $\mu$m×3.0 $\mu$m, the size of the P type active region is 27.8 $\mu$m×100 $\mu$m. As a result, by adopting the present invention, it is possible to make the size of the PHOS transistor in the output stage of the semiconductor device 0.65 times as small as that of the conventional PMOS transistor.

In this embodiment, the description has been given with respect to the PMOS transistor in the output stage of the semiconductor device. However the present invention may also be terminals of the semiconductor device for the purpose of protecting the NMOS transistor in an output stage of the semiconductor device or an internal circuit of the semiconductor device from the electrostatic breakdown.

Figure 2:
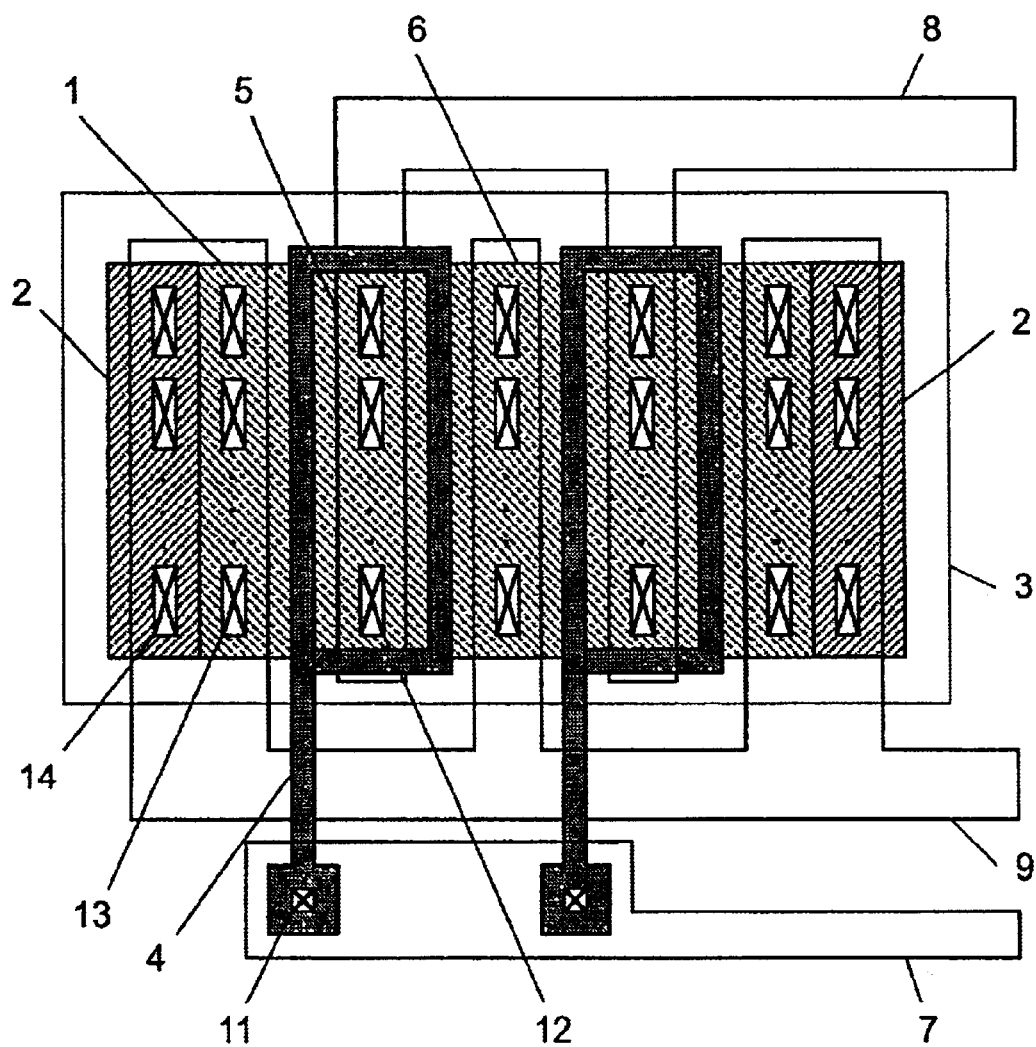
FIG. 2 is a plan view showing a structure according to a second embodiment of the present invention.
Figure 3:
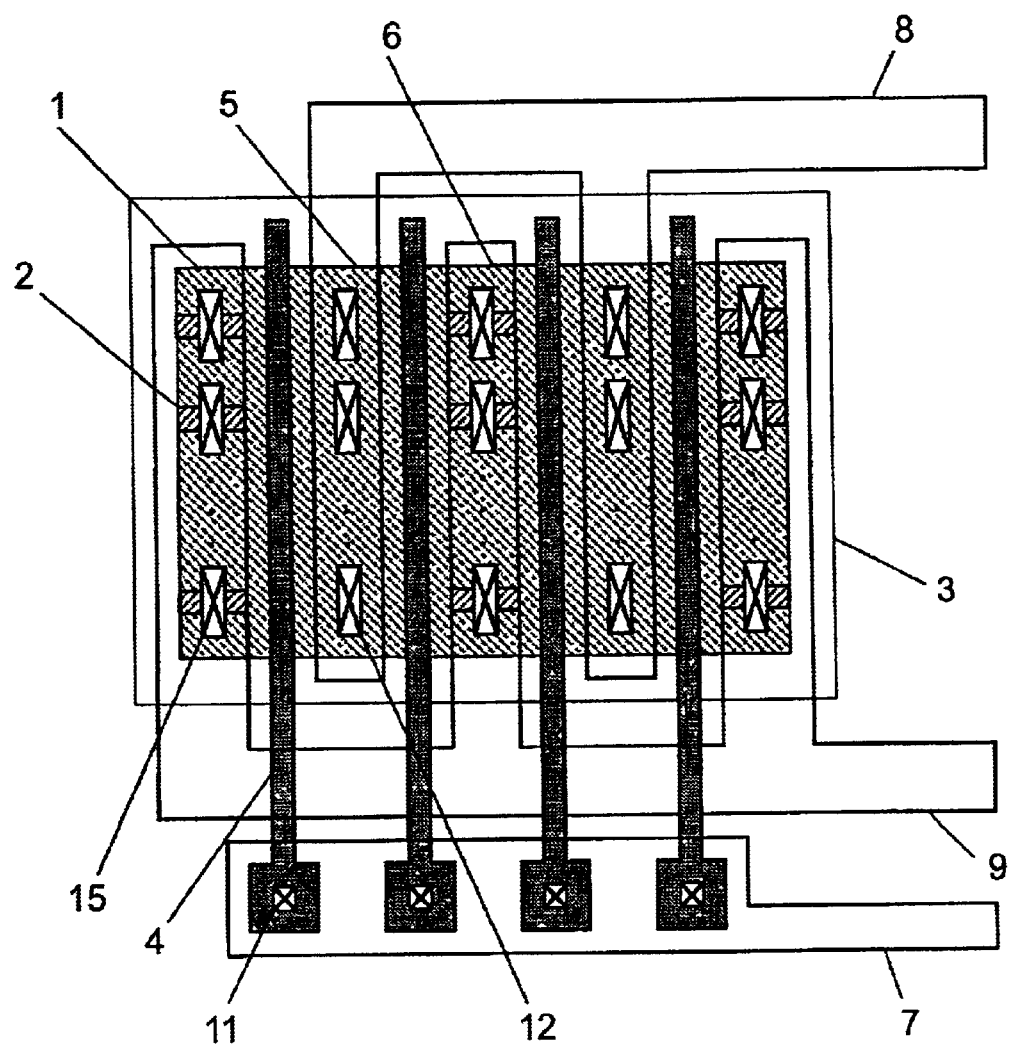
FIG. 3 is a plan view showing a structure according to a third embodiment of the present invention.

FIG. 2 is a plan view showing a structure of a MOS transistor according to a second embodiment of the present invention. The MOS transistor of the second embodiment is the same in shape as that of the first embodiment except for a specific shape in which the periphery of a drain region 5 of a PMOS transistor in an output stage of a semiconductor device is surrounded with a gate 4. In the second embodiment, the description has been given with respect to the PMOS transistor in the output stage of the semiconductor device. However, the present invention may also be applied to an NMOS transistor which is connected between the terminals of the semiconductor device for the purpose of protecting the NMOS transistor in an output stage of the semiconductor device or an internal circuit of the semiconductor device from the electrostatic breakdown, FIG. 3 is a plan view showing a structure of a MOS transistor according to a third embodiment of the present invention. In the third embodiment, the description will be given with respect to an example of a PMOS transistor in an output stage of a semiconductor device. The PMOS transistor includes four gates 4 each having a gate width of 100 µm. Thus, the width of the transistor is 400 µm in total, and the gate length is 1.0 µm. The transistor is formed in an N type well 3 having phosphorus diffused thereinto. Also, the transistor includes a P type active region 1 having boron diffused thereinto, and a drain region 5 and a source region 6 are both formed in the P type active region 1. An N type active region 2 for electric potential contact with the N type well is formed by diffusing arsenic. The gates 4 each made of polycrystalline silicon having phosphorus diffused thereinto are formed on the P type active region 1.

With respect to batting contacts of a gate, a drain, a source and a well of the MOS transistor, a contact 11 with 1.0 µm×1.0 µm is formed as the contact of the gate, contacts 12 each with 1.0 µm×3.0 µm are formed as the contacts of the drain at intervals of 1.0 µm, and batting contacts 15 each with 1.0 µm×3.8 µm are formed as the batting contacts of each of the source and the well at intervals of 1.0 µm. By employing a wiring made of aluminum mixed with a very small quantity of silicon and copper, the gate contact 11 is connected to a gate wiring 7, the drain contacts 12 are connected to a drain wiring 8, and the batting contacts 15 of each of the source and the well are connected to a source wiring 14. Now, a distance between the contact and the gate is 1.0 µm for the drain, and is 0.8 µm for the source. An amount of overlapping between the batting contacts 15 in the gate length direction and the N type active region 2 is 0.4 µm. The size of the N type active region 2 is 1.8 µm in the gate length direction, and is 0.8 µm in the transistor width direction. A distance between the contacts and the P type active region 1 is 1.0 µm for the drain and is 0.8 µm for the source.

Figure 6:
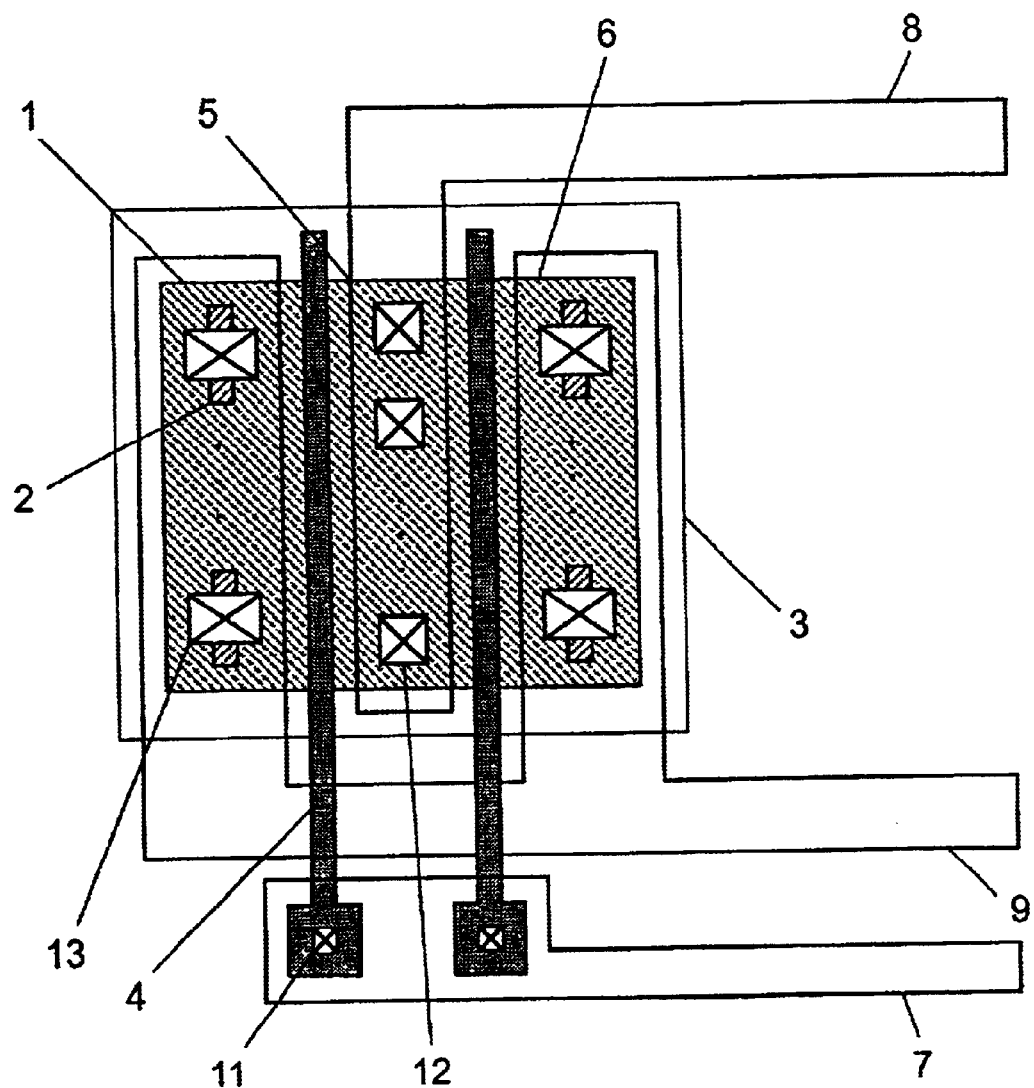
FIG. 6 is a plan view showing a structure of a MOS transistor of a second conventional example.

In this MOS transistor, an interval of adjacent gates is 3.0 µm for the drain and is 2.6 µm for the source. In the case of the conventional shape as shown in FIG. 6, the contact size of the drain is 3.0 µm×3.0 µm, and the size of the batting contact was 3.8 µm in the gate length direction and is 3.0 µm in the transistor width direction. In the case of this MOS transistor, an interval of adjacent gates is 5.0 µm for the drain and is 5.4 µm for the source. In the MOS transistor of the present invention, the size of the P type active region having the four gates is 17.8 m×100 m, whereas in the case of the conventional contact shape as shown in FIG. 3, the size of the P type active region having the four gates is 30.2 µm×100 µm. As a result, by adopting the present invention, it is possible to make the size of the PMOS transistor in the output stage of the semiconductor device 0.60 times as small as that of the conventional PMOS transistor.

In this embodiment, the description has been given with respect to the PMOS transistor in the output stage of the semiconductor device. However, the present invention may also be applied to an NMOS transistor which is connected between the terminals of the semiconductor device for the purpose of protecting the NMOS transistor in an output stage of the semiconductor device, or an internal circuit of the semiconductor device from the electrostatic breakdown.

Figure 4:
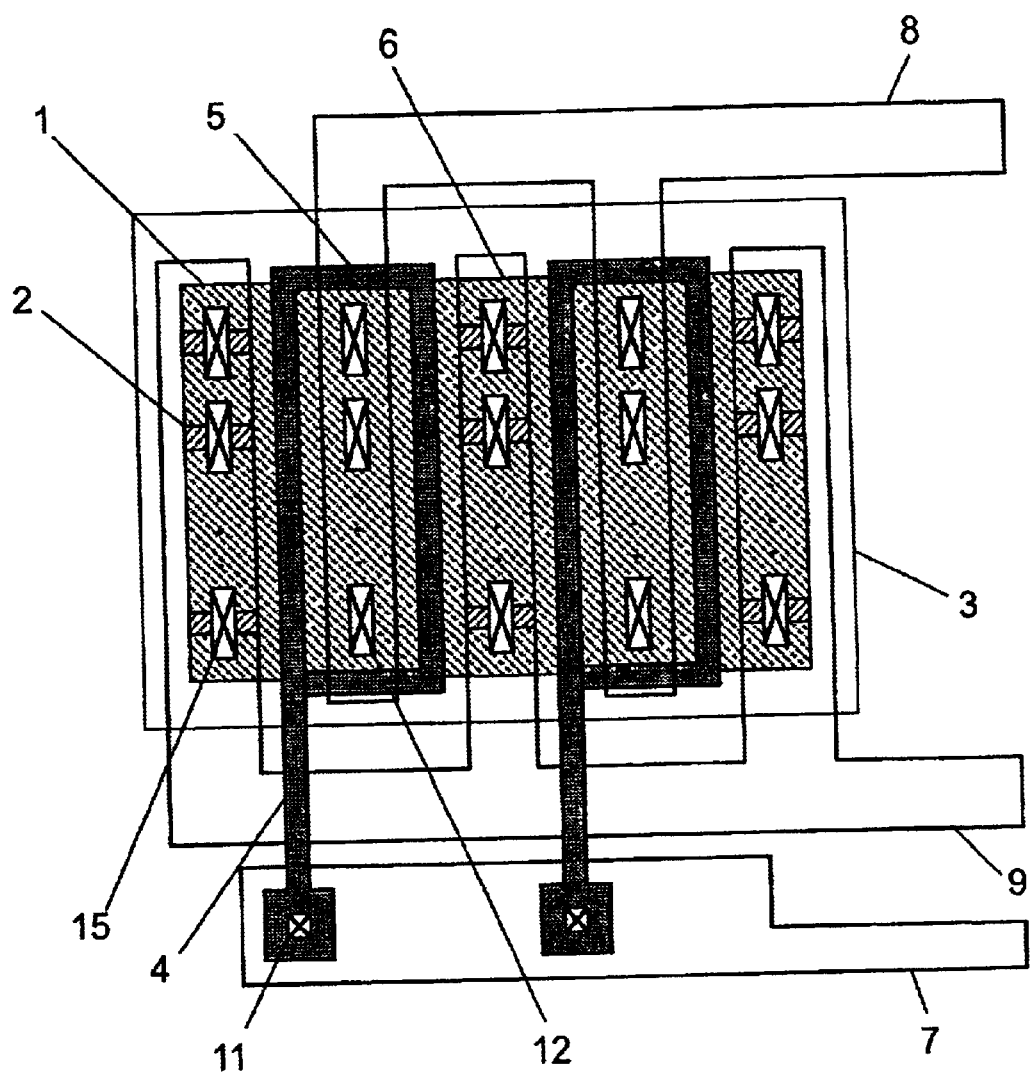
FIG. 4 is a plan view showing a structure according to a fourth embodiment of the present invention.
Figure 5:
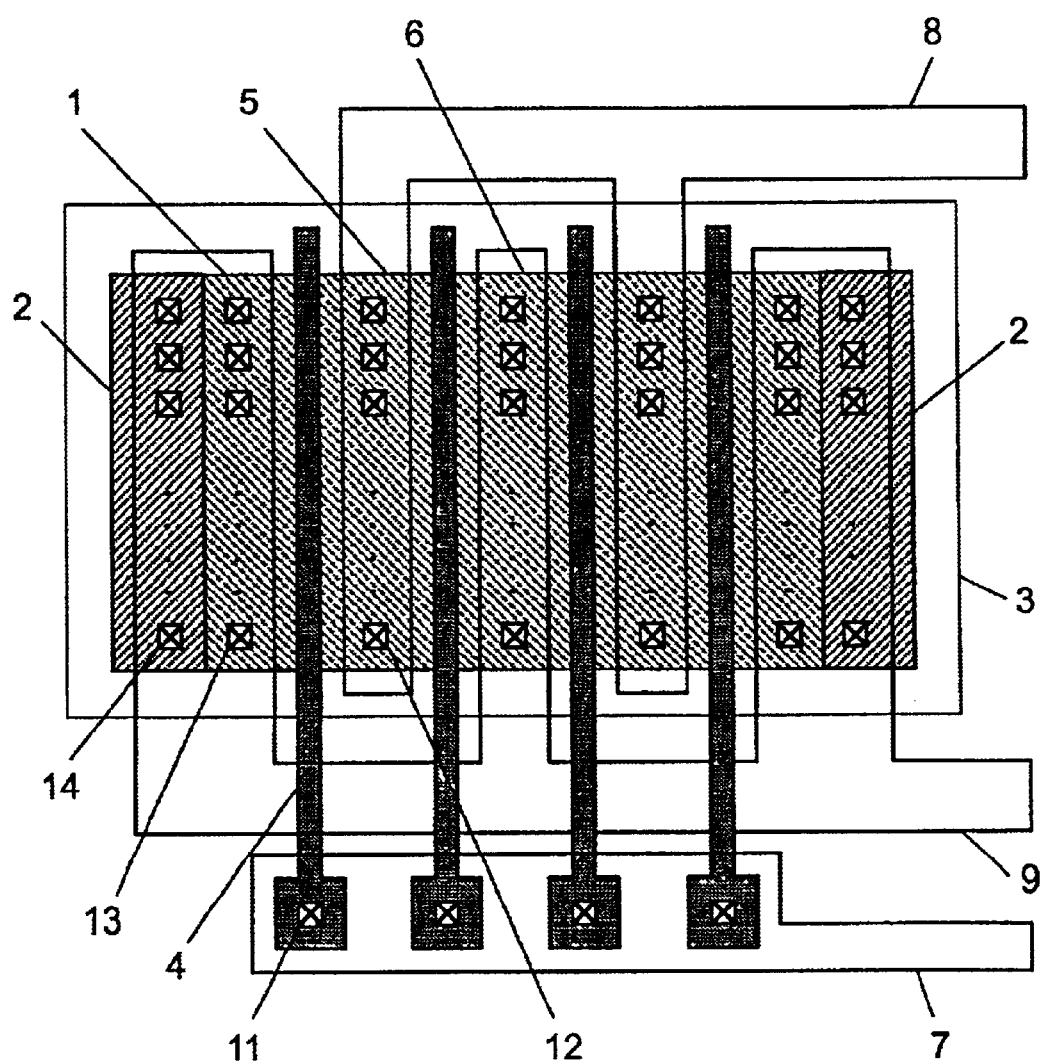
FIG. 5 is a plan view showing a structure of a MOS transistor of a first conventional example.

FIG. 4 is a plan view showing a structure of a MOS transistor according to a fourth embodiment of the present invention. The MOS transistor of the fourth embodiment is the same in shape as that of the third embodiment except for a specific shape in which the periphery of a drain region 5 of a PMOS transistor in an output stage of a semiconductor device is surrounded with a gate 4. In the fourth embodiment, the description has been given with respect to the PMOS transistor in the output stage of the semiconductor device. However the present invention may also be applied to an NMOS transistor which is connected between the terminals of the semiconductor device for the purpose of protecting the NMOS transistor in an output stage of the semiconductor device, or an internal circuit of the semiconductor device from the electrostatic breakdown.

As set forth hereinabove, according to the present invention, in a MOS transistor having a shape in which a plurality of gates are arranged in parallel with one another and being connected between terminals of a semiconductor device for the purpose of protecting the MOS transistor used in an output stage requiring a large current, or an internal circuit of the semiconductor device from the electrostatic breakdown, it is possible to provide a MOS transistor in which an interval of adjacent gates can be made smaller without degrading an allowable current.

For this reason, it is possible to provide an inexpensive power management IC, the necessity of which has been increased in recent years, which has: a function of being able to supply a stable power source, such as a voltage regulator, a switching regulator, or a charge pump regulator; a voltage monitoring function such as a voltage detector or a battery protection; or an over-current monitoring function.

While the present invention has been particularly shown and described with reference to the preferred embodiments, it will be understood that the various changes and modifications will occur to those skilled in the art without departing from the scope and true spirit of the invention. The scope of the invention is therefore to be determined solely by the appended claims.

What is claimed is:

1. A semiconductor device having a MOS transistor, the MOS transistor comprising: a plurality of gate electrodes; source and drain regions formed on opposite sides of the gate electrodes to define channel regions therebetween; a gate wiring pattern connected to the gate electrodes; a source wiring pattern connected to the source region; a drain wiring pattern connected to the drain region; one or more source contacts for connecting the source region to the source wiring pattern; one or more drain contacts for connecting the drain region to the drain wiring pattern; the one or more source contacts and the one or more drain contacts being longer in the channel width direction than in the channel length direction; and a well region and one or more well contacts connecting the well region to the source wiring pattern; the one or more source contacts and the one or more well contacts each comprising a batting contact having a diffusion region formed in the well region and a contact portion in contact with the diffusion region, one side of the diffusion region being shorter than an opposite side thereof.

2. A semiconductor device according to claim 1; wherein the shorter side of the source and drain contacts of the MOS transistor has a length defined by a minimum value imposed by a process used to form the contacts and a minimum value permitted by a contact rule used in manufacturing the MOS transistor.

3. A semiconductor device according to claim 2; wherein the channel width of the MOS transistor is longer than that of other MOS transistors in the semiconductor device.

4. A semiconductor device according to claim 3; wherein the MOS transistor has at least three gate electrodes.

5. A semiconductor device according to claim 3; wherein the MOS transistor is connected between terminals of the semiconductor device for protecting one of an output stage of the semiconductor device and an internal circuit of the semiconductor device from electrostatic breakdown.

6. A semiconductor device according to claim 3; wherein the MOS transistor is connected between terminals of the semiconductor device for protecting one of an output stage of the semiconductor device and an internal circuit of the semiconductor device from electrostatic breakdown; and the semiconductor device is one of a voltage regulator, a switching regulator, and a charge pump circuit.

7. A semiconductor device according to claim 1; wherein an amount of overlap between the contact portions and the diffusion regions of the batting contact in the gate length direction is 1.8 μm.

8. A semiconductor device according to claim 1; wherein the diffusion region is shorter in the channel width direction than in the channel length direction.

9. A semiconductor device according to claim 8; wherein the contact portion of the batting contact is longer in the channel width direction than in the channel length direction.

10. A semiconductor device having a MOS transistor, the MOS transistor comprising: a plurality of gate electrodes; source and drain regions formed on opposite sides of the gate electrodes to define channel regions therebetween; a gate wiring pattern connected to the gate electrodes; a source wiring pattern connected to the source region; a drain wiring pattern connected to the drain region; one or more source contacts for connecting the source region to the source wiring pattern; one or more drain contacts for connecting the drain region to the drain wiring pattern; the one or more source contacts and the one or more drain contacts being longer in the channel width direction than in the channel length direction; and a well region and a plurality of well contacts each comprised of a diffusion region formed in the well region and being longer in the channel length direction than in the channel width direction, and a contact portion formed on the diffusion region and being longer in the channel width direction than in the channel length direction.

11. A MOS transistor comprising: a well region having a first conductivity type; an active region having a second conductivity type formed in the well region; a plurality of gate electrodes formed on the active region over channel regions defined in the active region; one or more source regions formed in the active region on a first side of each respective gate electrode in a channel length direction of the MOS transistor; one or more drain regions formed in the active region on a second side opposite the first side of each respective gate electrode in a channel length direction of the MOS transistor; a plurality of source contacts arranged in each source region; and a plurality of drain contacts arranged in each drain region; wherein the source contacts and the drain contacts are arranged in an array extending in the channel width direction of the MOS transistor, and the source contacts and drain contacts are longer in the channel width direction of the MOS transistor than in a channel length direction of the MOS transistor; and wherein a distance between the drain contacts and an adjacent gate electrode is 1.0 μm.

12. A MOS transistor comprising: a well region having a first conductivity type; an active region having a second conductivity type formed in the well region; a plurality of gate electrodes formed on the active region over channel regions defined in the active region; one or more source regions formed in the active region on a first side of each respective gate electrode in a channel length direction of the MOS transistor; one or more drain regions formed in the active region on a second side opposite the first side of each respective gate electrode in a channel length direction of the MOS transistor; a plurality of source contacts arranged in each source region; and a plurality of drain contacts arranged in each drain region; wherein the source contacts and the drain contacts are arranged in an array extending in the channel width direction of the MOS transistor, and the source contacts and drain contacts are longer in the channel width direction of the MOS transistor than in a channel length direction of the MOS transistor; and wherein a distance between the source contacts and an adjacent gate electrode is 0.8 μm.

13. A MOS transistor comprising: a well region having a first conductivity type; an active region having a second conductivity type formed in the well region; a plurality of gate electrodes formed on the active region over channel regions defined in the active region; one or more source regions formed in the active region on a first side of each respective gate electrode in a channel length direction of the MOS transistor; one or more drain regions formed in the active region on a second side opposite the first side of each respective gate electrode in a channel length direction of the MOS transistor; a plurality of source contacts arranged in each source region; and a plurality of drain contacts arranged in each drain region; wherein the source contacts and the drain contacts are arranged in an array extending in the channel width direction of the MOS transistor, and the source contacts and drain contacts are longer in the channel width direction of the MOS transistor than in a channel length direction of the MOS transistor; and wherein a distance between adjacent gate electrodes is 3.0 μm.

14. A MOS transistor comprising: a well region having a first conductivity type; an active region having a second conductivity type formed in the well region; a plurality of gate electrodes formed on the active region over channel regions defined in the active region; one or more source regions formed in the active region on a first side of each respective gate electrode in a channel length direction of the MOS transistor; one or more drain regions formed in the active region on a second side opposite the first side of each respective gate electrode in a channel length direction of the MOS transistor; a plurality of source contacts arranged in each source region; a plurality of drain contacts arranged in each drain region; and a well region and one or more well contacts formed in the well region; wherein the source contacts and the drain contacts are arranged in an array extending in the channel width direction of the MOS transistor, and the source contacts and drain contacts are longer in the channel width direction of the MOS transistor than in a channel length direction of the MOS transistor; and wherein the plurality of well contacts each comprise a batting contact having a rectangular diffusion region formed in the well region and being shorter in the channel width direction than in the channel length direction, and a rectangular contact portion in contact with the diffusion region and being longer in the channel width direction than in the channel length direction.

15. In a semiconductor device having an internal circuit comprised of MOS transistors, external connection terminals, and a protective MOS device connected to at least the external connection terminals, the protective MOS device comprising: a plurality of gate electrodes; source and drain regions formed on opposite sides of the gate electrodes; a plurality of rectangular source contacts arranged in an array in the channel width direction in the source region; and a plurality of rectangular drain contacts arranged in an array in the channel width direction in the drain region; the source and drain contacts being longer in the channel width direction than in the channel length direction to enable a reduction in width of the MOS protective device; and a well region and one or more well contacts connecting the well region to the source wiring pattern; the plurality of source contacts and the plurality of well contacts each comprising a batting contact having a diffusion region formed in the well region and being shorter in the channel width direction than in the channel length direction, and a contact portion in contact with the diffusion region and being longer in the channel width direction than in the channel length direction.

* * * * *